United States Patent
Barnes (10) Patent No.: US 7,739,641 B1
(45) Date of Patent: Jun. 15, 2010

(54) INTEGRATED CIRCUIT HAVING A CLOCK TREE

(75) Inventor: Paul Barnes, Chepstow (GB)

(73) Assignee: STMicroelecronics (Research & Development) Limited, Buckinghamshire (GB)

( * ) Notice: Subject to any disclaimer, the term of this patent is extended or adjusted under 35 U.S.C. 154(b) by 591 days.

(21) Appl. No.: 11/700,532

(22) Filed: Jan. 31, 2007

(30) Foreign Application Priority Data

Feb. 3, 2006 (EP) .................................. 06250609

(51) Int. Cl.
*G06F 17/50* (2006.01)
*G06F 9/45* (2006.01)

(52) U.S. Cl. ............................................... 716/6
(58) Field of Classification Search .................. None
See application file for complete search history.

(56) References Cited

U.S. PATENT DOCUMENTS

| | | | | |
|---|---|---|---|---|
| 5,896,299 A * | 4/1999 | Ginetti et al. | .................. | 716/4 |
| 6,550,044 B1 | 4/2003 | Pavisic et al. | | |
| 6,550,045 B1 * | 4/2003 | Lu et al. | ........................ | 716/6 |
| 6,795,954 B2 * | 9/2004 | Andreev et al. | ................. | 716/6 |
| 6,810,515 B2 * | 10/2004 | Lu et al. | ........................ | 716/18 |
| 6,907,590 B1 | 6/2005 | Al-Dabagh et al. | | |
| 6,941,533 B2 * | 9/2005 | Andreev et al. | ................. | 716/6 |
| 7,039,891 B2 * | 5/2006 | Tetelbaum | .................... | 716/13 |
| 7,075,336 B2 * | 7/2006 | Kojima et al. | .................. | 326/93 |
| 7,296,246 B1 * | 11/2007 | Kuehlmann et al. | ............ | 716/2 |
| 2002/0124230 A1 * | 9/2002 | Cai et al. | ........................ | 716/6 |
| 2003/0014724 A1 | 1/2003 | Kojima et al. | | |
| 2004/0076067 A1 | 4/2004 | Andreev et al. | | |
| 2004/0078766 A1 | 4/2004 | Andreev et al. | | |
| 2006/0064658 A1 * | 3/2006 | Minonne et al. | ............... | 716/6 |

* cited by examiner

*Primary Examiner*—Leigh Marie Garbowski (57) ABSTRACT

A method of operating a computer to generate a timing constraints file for controlling a clock tree synthesis tool, the method comprising: inputting into the computer data defining a circuit to be synthesised, the circuit including a plurality of timing paths each including at least one of a first timing portion, a second timing portion and a third timing portion; executing a tool in the computer to read the data and to analyse the delay on each the first and third portion of each the timing path, to compare the delays and to set a clock latency for at least one of start and end points of the second portion of at least one timing path in dependence on the comparison; and outputting a timing constraints file including commands for controlling the clock tree synthesis tool, the commands defining the clock latencies.

20 Claims, 5 Drawing Sheets

FIGURE 1

PRIOR ART

INTEGRATED CIRCUIT HAVING A CLOCK TREE

CROSS-REFERENCE TO RELATED APPLICATIONS

The present application is related to European Patent Application No. 06250609.2, filed Feb. 3, 2006, entitled "A METHOD OF MAKING AN INTEGRATED CIRCUIT INCLUDING A CLOCK TREE". European Patent Application No. 06250609.2 is assigned to the assignee of the present application and is hereby incorporated by reference into the present disclosure as if fully set forth herein. The present application hereby claims priority under 35 U.S.C. §119(a) to European Patent Application No. 06250609.2.

TECHNICAL FIELD

The present disclosure relates to a system and method of making an integrated circuit having clock tree, and in particular to a system and method for designing such a clock tree. In addition, the present disclosure also provides a tool for implementing the system and method.

BACKGROUND

As the size and complexity of integrated circuits increases, so do the pressures on designing clock trees for the circuits. Designers face an increasing number of logic gates, registers, register banks etc which need to deliver, act on and receive suitably timed signals.

There are various automated techniques for designing clock trees based on a circuit which has been defined in terms of its logical design and which is to be implemented physically. That is, a clock tree synthesis tool forms parts of a physical design process. One such tool is the Astro clock tree synthesis tool sold by Synopsys, which receives information concerning the logic circuit including an sdc (Synopsys Design Constraint) file which contains timing constraints in TCL format.

Figure 1:
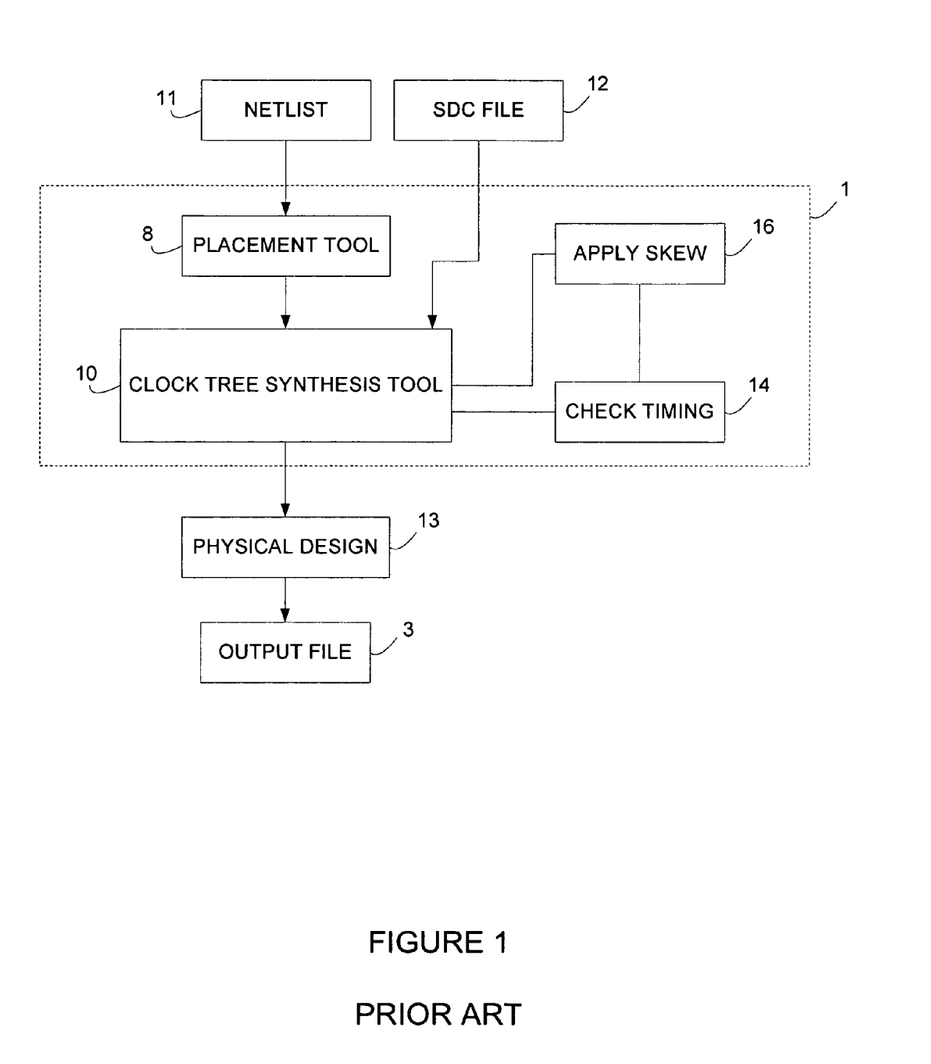
FIG. 1 is an exemplary schematic diagram illustrating components in a conventional design process.

FIG. 1 generally illustrates how this tool is used in the physical design process. A cell placement tool 8, responsible for placing cells in a circuit layout, receives information from a Netlist 11 together with constraints that the Netlist must meet in the form of an sdc file 12 and operates to place logic circuits such as gates, registers, etc. The Netlist 11 and sdc file 12 hold data and criteria defining a circuit to be synthesized, which is used to load a database (not shown). The output of the placement tool 8 is supplied to a clock tree synthesis tool 10 which constructs clock trees based on the cell layout. The clock tree synthesis tool 10 also receives timing constraints from the sdc file 12. The clock tree synthesis tool updates the database which is used for other design processes such as routing etc, represented by block 13. The output of the design process is a file 3 which can be supplied to manufacture the circuit.

The tool 10 supports an optimization process illustrated in FIG. 1. That is, it implements a timing check after placement and routing by the Astro tool 10 and determines whether or not there is any opportunity to improve the timing of the circuit by applying useful skew 16. Useful skew is a well known concept in the design of circuits, and involves altering delays on critical paths to improve the timing of the circuit. This can involve increasing the delay on a path between a start point and an end point, in dependence on the timing of other associated paths. Reference numeral 16 denotes the step of applying useful skew in the clock tree synthesis process by feeding back timing information to the clock tree synthesis tool 10.

However, conventional techniques have many difficulties associated with it. The options for skewing may be restricted after initial placement of the logic circuits, or the initial placement and any modified placement may be sub-optimal because the placement tool 8 has initially tried to meet a timing constraint of zero skew.

SUMMARY

The present disclosure provides an integrated circuit having a clock tree. The present disclosure also provides a system and method of producing an integrated circuit having a clock tree.

In one embodiment, the present disclosure provides a method of a method of controlling a clock tree synthesis tool for use in producing integrated circuits. The method includes inputting data defining a circuit to be synthesized, said circuit comprising a plurality of timing paths. The method also includes comparing said delays of each of said timing paths. The method further includes setting the clock latency for at least one of: a start point and an end point of at least one of said timing paths according to said comparison. The method further includes outputting timing constraints to control a clock tree synthesis tool, wherein said timing constraints comprise commands defining said clock latencies.

In another embodiment, the present disclosure provides a method of generating timing constraints. The method includes inputting data defining a circuit to be synthesized. The circuit includes a plurality of timing paths each including at least one of: a first timing portion, a second timing portion, and a third timing portion. The method further includes comparing said delays on each of said first and third timing portions of each of said timing paths. The method still further includes setting a clock latency for at least one of: a start point and an end point of said second port of at least one of said timing paths according to said comparison. Lastly, the method includes outputting said timing constraints to control a clock tree synthesis tool, where the timing constraints include commands defining said clock latencies.

In still another embodiment, the present disclosure provides a system to generate timing constraints to control a clock tree synthesis tool. The system includes an input to receive data defining a circuit to be synthesized. The circuit includes a plurality of timing paths, each including a start portion, a critical path and an end portion. The system is operable to report the worst negative slack for all timing paths and to set a critical range, and to improve at least one of said timings paths by incrementing a compile step by the worst negative slack. If the worst negative slack does not satisfy preset criteria, then the system analyzes the delay on each start and end portion to adjust clock latencies to improve the worst negative slack.

Other technical features may be readily apparent to one skilled in the art from the following figures, descriptions and claims.

BRIEF DESCRIPTION OF THE DRAWINGS

For a more complete understanding of this present disclosure and its features, reference is now made to the following description, taken in conjunction with the accompanying drawings, in which.

DETAILED DESCRIPTION

Figure 2:
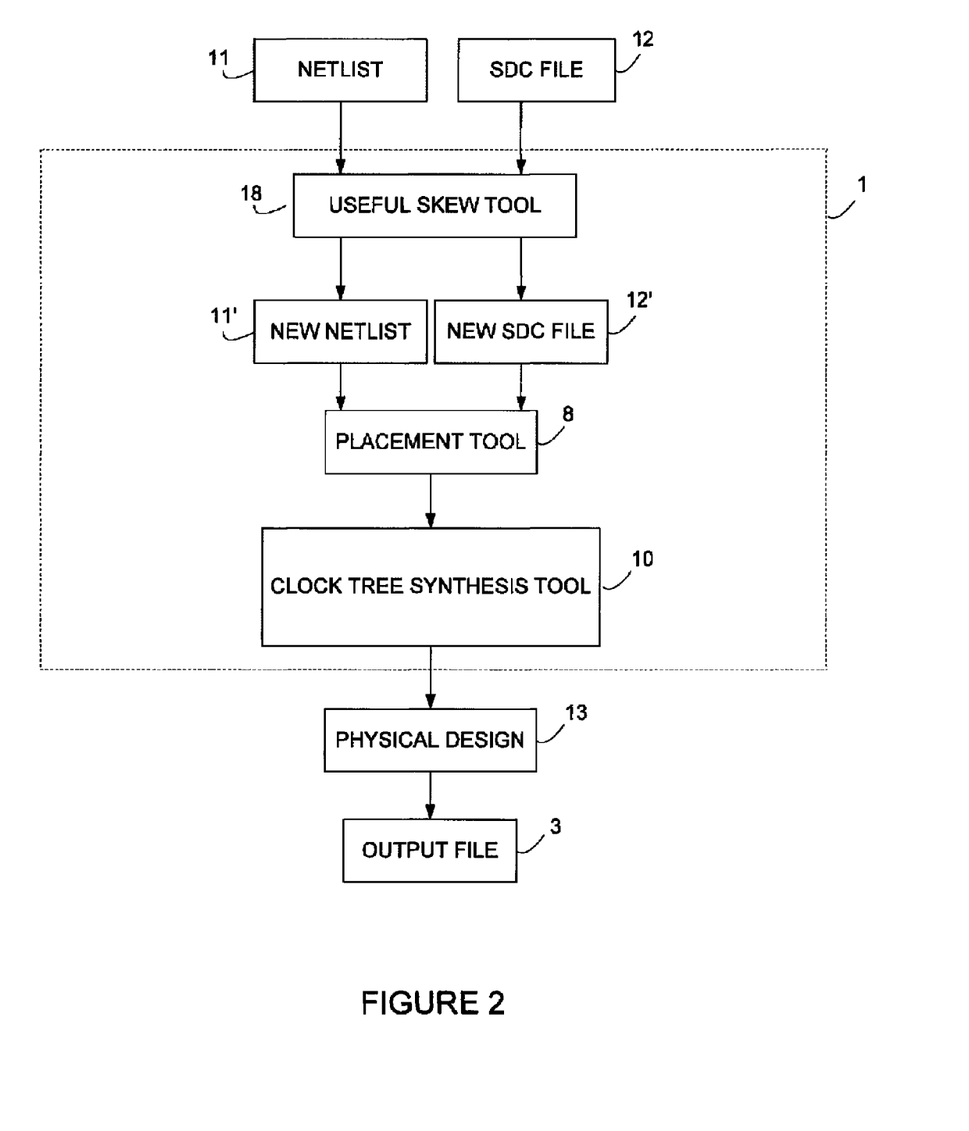
FIG. 2 is an exemplary schematic block diagram illustrating components involved in a design process according to one embodiment of the present disclosure.

FIG. 2 one embodiment of the present disclosure in which like numerals denote like parts as in FIG. 1. Reference numeral 1 denotes in schematic form a computer on which the tools discussed herein can be executed. The computer has an input interface for receiving data in the form of a file, such as hard drive, network connection, etc and an output which may take any known form for generating an output file.

As will be explained more fully in detail herein, in this case the sdc file 12 and Netlist 11 are supplied to a useful skew tool 18 which inserts additional clock latency commands into a modified sdc file 12'. The tool 18 also generates a modified Netlist 11'. The Netlist includes data defining a circuit to be synthesized. The sdc file contains constraints that the Netlist must meet. This applies to the former Netlist 11 and sdc file 12 as well as to the modified versions 11', 12' thereof.

In one embodiment, the useful skew tool 18 receives information in the form of a Netlist 11 and sdc file 12 concerning the logic circuit at the logic synthesis stage (prior to cell placement) and applies useful skew or active clock skewing at that stage, rather than in the later stages of the physical design process. The useful skew tool 18 manipulates the amount of the clock cycle available to parts of the design to effectively increase the cycle time available on critical paths by setting clock latencies on individual registers or register banks.

In one embodiment, the clock latencies are added to source constraints and imported into the exported sdc file 12' in the form of set_clock_latency commands which define the clock latency per register or register block. The modified sdc file 12', including the set_clock_latency commands is then supplied to the cell placement tool 8, and to the clock tree synthesis tool 10.

Figure 3:
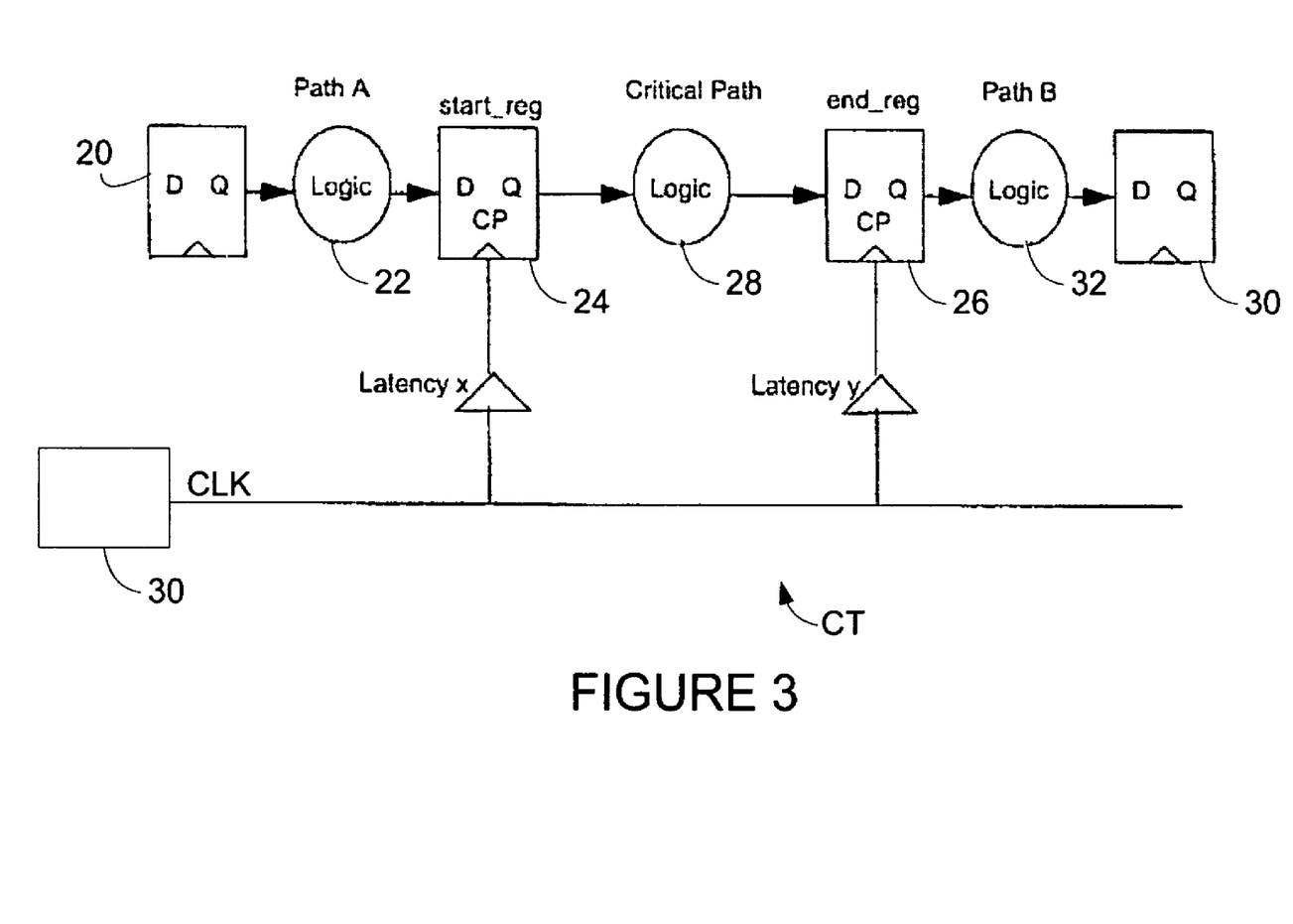
FIG. 3 is an exemplary schematic block diagram illustrating circuitry to which one embodiment of the present disclosure may be applied.

Operation of the useful skew tool can be better understood by reference to FIG. 3 which illustrates an example of a timing path in an integrated circuit including logic circuits. In one embodiment, a first flip-flop 20 is connected via functional logic 22 to a start register 24. The path between the first flip-flop 20 and the start register 24 is referred to herein as path A. The start register 24 is connected to an end register 26 via functional logic 28 which constitutes a critical path CP. The end register 26 is connected to a second flip-flop 30 via functional logic 32. The path between the end register 26 and the second flip-flop 30 is referred to herein as path B.

In one embodiment, a clock CLK is wired from a clock source 30 via a clock tree CT to the start register 24 and end register 26. The clock latency from the clock source 30 to the start register is shown diagrammatically as latency x and the clock latency from the clock source 30 to the end register is shown diagrammatically as latency y. The useful skew tool 18 analyzes the design critical path to see if either or both of path A and path B have any spare slack. Slack is referenced to a default value for the clock latency, and refers to the relative timing on path A.

In one embodiment, the delay between an edge arriving at the Q output of flip-flop 20, being acted on by the functional logic 22 and supplied to the D input of the start register 24 is determined. If this is less than the default value for the clock latency, then it is possible to reduce the value for latency x to be less than the default value p of that clock. It will readily be understood that in a real circuit there will be numerous paths, registers, logic circuits and clocks.

The term "slack" is used above with the following meaning. For example, "slack" is a measure of how closely the Netlist meets the timing constraints of the sdc file. If the Netlist meets the constraints imposed by the sdc file exactly, there is zero slack. If the Netlist does not meet the design target defined by the constraints, there is negative slack and if there is some room to maneuver between the Netlist and the constraints there is said to be positive slack.

In one embodiment, The new value for latency x is the clock default value latency p minus slackA, which is the slack on path A. That is, if the functional logic 22 acts more quickly than the current timing allowed for it by the clock default value, then the clock latency can be reduced so as to optimize that timing and, importantly, therefore allow more time on the critical path of functional logic 28.

Similarly, if it is determined that there is slack in path B, then the value for latency y can be increased to a new value of the clock default latency p plus slackB, where slackB is the slack on path B.

Latencies are set in practice by the root and branches of the clock tree, made up of buffers with known delays. This allows latencies to be adjusted by the removal or insertion of buffers in the clock tree synthesis stage. The useful skew tool 18 imports the necessary clock commands into the sdc file 12' in the following forms:

The default latency p is set by the following, where "clock" identifies each particular clock by its unique identifier:

set_clock_latency p [get_clocks clock]

The latency x is defined by the following, where x=p−slackA:

set_clock_latency y [get_pins start_reg/CP]

The latency y is defined by the following, where y=p+slackB:

set_clock_latency x [get_pins end_reg/CP]

(set_clock_latency is the standard sdc constraint for modelling clock tree latency before real clock trees are inserted). The term in square brackets defines the clock pin [CP] for the particular register [start_reg, end_reg] at which the latency x, y is to be set.

Figure 4:
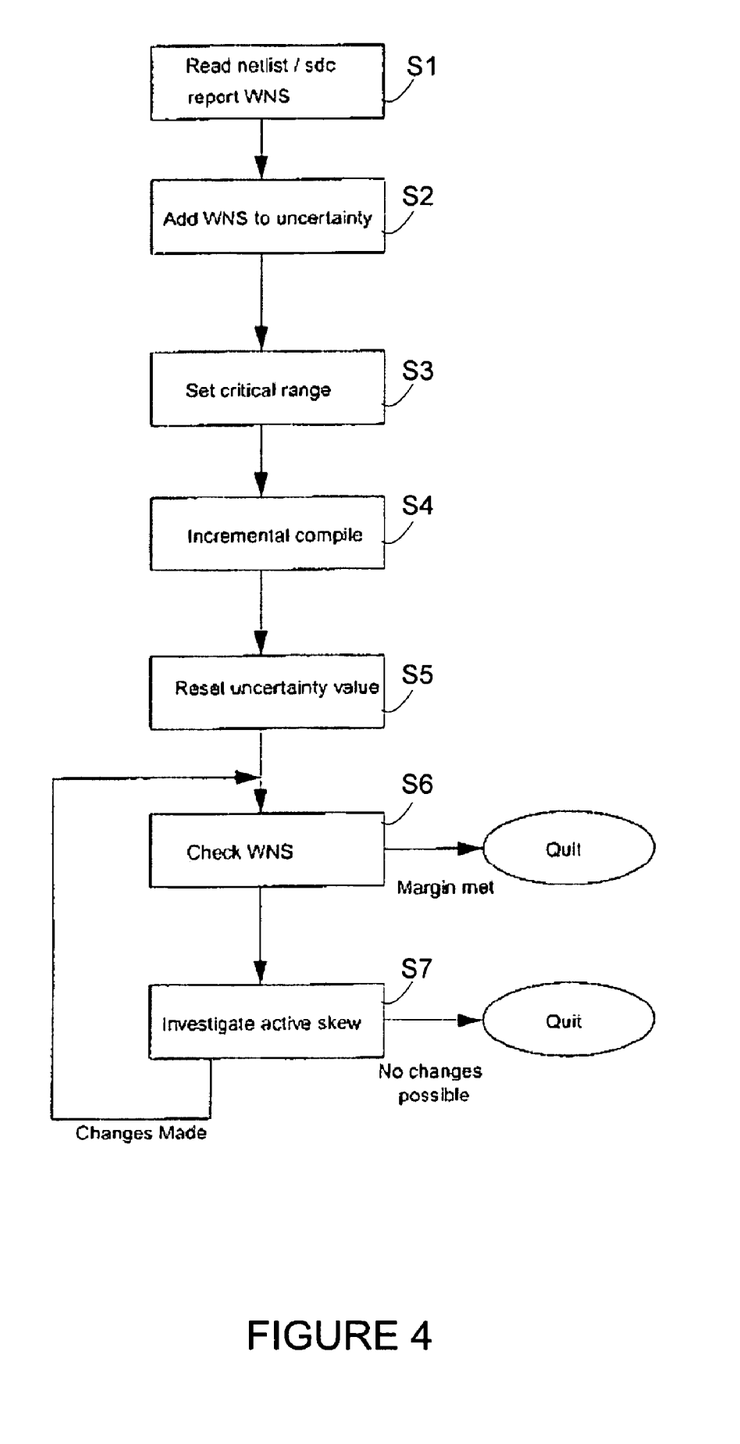
FIG. 4 is an exemplary flow chart illustrating operation of a useful skew tool according to one embodiment of the present disclosure.

FIG. 4 is a flow chart which illustrates the procedure adopted by the useful skew tool 18 to implement the above described analysis. The code for implementing the tool is shown in Annexes I and II, with appropriate parts marked in correspondence with the steps in FIGS. 4 and 5.

Reference is first made to FIG. 4 and Annex I. Note that Annex I includes code for set up procedures which are not discussed herein. Step S1 is an initialization step, i.e. read Netlist and constraints and identify the worst negative slack (WNS). The worst negative slack is the worst of the slack on all paths, and is determined by reporting the slack on each path and comparing it with the last measured value for worst slack. In this step, the uncertainty settings, setup margin and granularity are also established. As is well known, the uncertainty value for a design is a value which model certain physical effects and represents an inherent delay parameter.

At step S2, the WNS value is added to the uncertainty value (including an adjustment for margins).

At step S3, the critical range is set to twice the WNS, once again adjusted for margin. The critical range is a range set within which all failing paths should fall. A failing path is a path that has negative slack.

At step S4 an incremental compile step is conducted which attempts to fix all paths to be better than WNS from the target. The effect of this is to force any path that can improve by the WNS to do so which has the effect of producing an over constrained design. The uncertainty value is reset to its original value in step S5.

At step S6, the WNS is checked to see if it satisfies WNS for the design. If it does, the program quits. If it does not, the program proceeds to step S7.

At step S7, active skew possibilities are investigated. This involves checking the slack on each path and possibly changing it, in a manner which will be described in more detail later. If changes are made, the procedure returns to step S7 for a further reiteration. If no changes are made, the procedure returns to step S6 to check the worst negative slack and to quit if it is now okay. If no changes are possible, the program quits. In Annex I, step S7 includes a call to an apply_skew routine: source$TOOL_PATH/bin/apply_skew.tcl. This is set out in Annex II.

Figure 5:
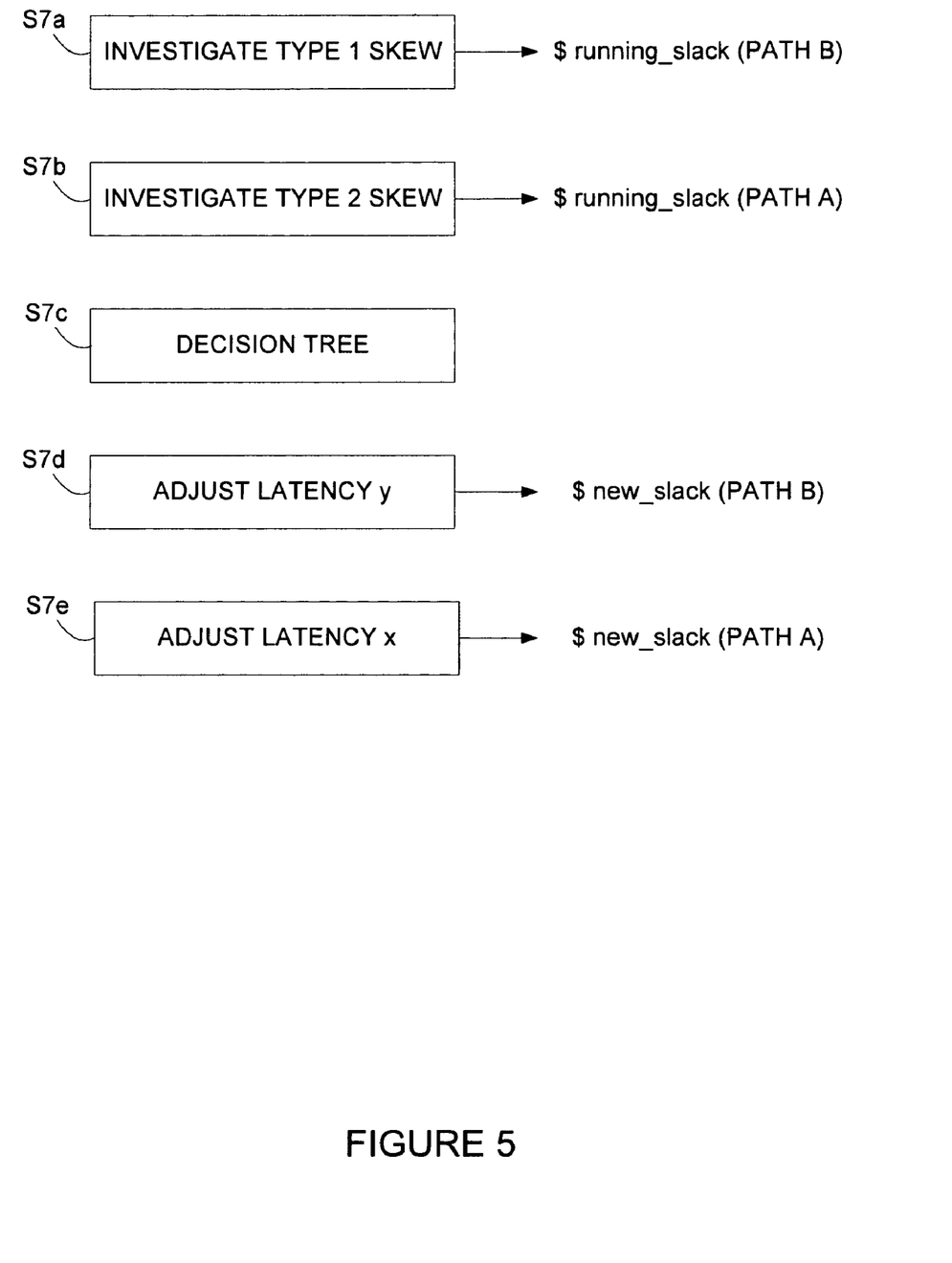
FIG. 5 is a flow chart illustrating the steps of an active skew investigation process implemented by the useful skew tool according to one embodiment of the present disclosure.

Reference will now be made to FIG. 5 (and Annex II) to describe in more detail the process involved in investigating active skew possibilities (step S7 in FIG. 4).

At step S7a, type 1 skew possibilities are investigated. These possibilities lie on PATH B in FIG. 3, where it is investigated whether or not it is possible to delay the end point of a critical path. If there is greater than zero slack from the end point register, it is possible to adjust the clock latency to latency y as described above with reference to FIG. 3. In Annex II, step S7a is shown as terminating in defining the parameter $ running_slack as the timing parameter for each path B.

Next, type 2 skew is investigated. This is the skew on PATH A, where it is investigated whether or not it is possible to advance the start point on a critical path. Once again, the execution of the code illustrated in step S7b of Annex 2 results in the setting of the parameter $ running_slack for each path A.

At step S7c, there is a decision tree to determine which clock latencies to adjust in view of the investigations carried out in step S7a and steps 7b. At step 7d, latency y is adjusted and at step S7e latency x is adjusted. The new running slacks are then reported and are used to replace the value for running slack used in step S7 to investigate active skew. So the design slack should gradually improve as the step S7 is repeated—running slack holds the current WNS value.

It should be understood that Annex I and II are included for illustration purposes only. Any suitable code may be used in accordance with the present with the present disclosure. It should also be understood that the present disclosure may be implemented in any computer readable medium.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this present disclosure has described certain embodiments and generally associated methods, alterations and permutations of these embodiments and methods will be apparent to those skilled in the art. Accordingly, the above description of example embodiments does not define or constrain this present disclosure. Other changes, substitutions, and alterations are also possible without departing from the spirit and scope of this present disclosure, as defined by the following claims.

ANNEX I

```
echo "--------------------------------------------------"
echo "Note: Starting Active Clock Skew stage."
echo "--------------------------------------------------"
set physical_library { }
# get techno info
source $TOOL_PATH/techno/$TECHNO/techno.tcl
# read netlist
read_verilog -netlist deliverables/$ms_dName.v
current_design $ms_dName
link
# read design constraints
source deliverables/$ms_dName.set_ideal_net.tcl
source deliverables/$ms_dName.set_ideal_latency.tcl
source scripts/constraints.tcl
source scripts/timing_exceptions.tcl
# May need this if off chip latency set in constraints and
# dc_shell gets confused
# set_clock_latency -source 0.0 [get_clocks *]
# May need this if I/O timing paths are seen in Reg->Reg paths
# set_false_path -from [all_inputs]
# set_false_path -to [all_outputs]
# constrain clock gating cells
if { [is_false [info exists CONSTRAIN_CG_CELLS ] ] } \
    {
    set CONSTRAIN_CG_CELLS false
    }
if { [is_true $CONSTRAIN_CG_CELLS ] } \
    {
    source scripts/constrain_cg_cells.tcl
    }
source deliverables/$ms_dName.path_groups.tcl
# set target library for compile
if { [is_false [info exists LL_TARGET_LIB ] ] } \
    {
    echo "Fatal Error: LL_TARGET_LIB not defined"
    exit -1
    }
set target_library $LL_TARGET_LIB
# check list of register to register path groups is set
if { [is_false [info exists RR_PATH_GROUP_LIST ] ] }\
    {
    echo "Fatal Error: No path groups set"
    exit 1
    }
# Get target design area
if { [is_false [info exists TARGET_AREA ] ]}\
    {
    set TARGET_AREA 0.0
    }
set target_area $TARGET_AREA
# Scan is already inserted
set_scan_configuration -existing_scan true
# Make sure registers and dont_touch cells are not optimised
set_compile_directives -del false -const false -local false -crit false [all_registers]
if {[is_false [info exists CELLS_NOT_TO_TOUCH_BASE_NAME_LIST ]
] }\
    {
    set CELLS_NOT_TO_TOUCH_BASE_NAME_LIST [list
    inst_c8cmg_notech
]
    }
set template_cmnd {set dont_touch_cells [get_cells -hier * -
```

ANNEX I-continued

```
filter {full_name =~"*ID*"} ]}
for each CELL_BASE_NAME $CELLS_NOT_TO_TOUCH_BASE_
NAME_LIST \
    {
    set valid [regsub -all {ID} $template_cmnd $CELL_BASE_NAME
cmnd ]
    eval $cmnd
    foreach_in_collection dont_touch_cell $dont_touch_cells \
        {
        set_compile_directives -del false -const false -local false
-crit false [get_cells $dont_touch_cell]
        }
    }
foreach_in_collection design [get_designs "*" ] \
    {
    current_design $design
    set_fix_multiple_port_nets -all -buffer_constants
    }
\current_design $ms_dName
set compile_sequential_area_recovery true
# Check initial state of design
report_constraint
# incremental compile to generate reference
source $TOOL_PATH/bin/area_recovery.tcl
update_timing
STEP S1
# find slack / clock / uncertainty settings and set worst slack
set worst_slack 0.0
foreach path_group $RR_PATH_GROUP_LIST \
    {
    set ref_slack($path_group) [ get attribute [ get_timing_paths
-group $path_group ] slack]
    set ref_clock($path_group) [ get_object_name [ get_attribute [
get_timing_paths -group $path group ] endpoint_clock ] ]
    set ref_uncertainty($path_group) [ get_attribute -quiet ]
get_clocks $ref_clock($path_group) ] plus_uncertainty ]
    if {$ref_uncertainty($path_group) == ""}
        {
        set ref_uncertainty($path_group) 0.0
        }
    if { $ref_slack($path_group) < 0 } \
        {
        echo "found negative slack of" $ref_slack($path_group) "on
path_group" $path_group
        if {$ref_slack($path_group) < $worst_slack } \
            {
            set worst_slack $ref_slack($path_group)
            }
        }
    }
if { [is_false [info exists SETUP_MARGIN ]]} \
    {
    set SETUP_MARGIN 0.0
    }
if {[is_false [info exists GRANULARITY ] ]} \
    {
    set GRANULARITY 0.1
    }
STEP S2
# increase uncertainty on each clock by > the magnitude of
negative slack plus 2x margin
foreach path_group $RR_PATH_GROUP_LIST \
    {
    set uncertainty [ expr ( $SETUP_MARGIN \* 2 ) +
$ref_uncertainty($path_group) + ( $ref_slack($path_group) \* -1
) ]
    set rounded_uncertainty [expr floor ( $uncertainty /
$GRANULARITY ) \* $GRANULARITY + $GRANULARITY ]
    set_clock_uncertainty    $rounded_uncertainty
$ref_clock ($path_group)
    echo "setting clock uncertainty of" $rounded_uncertainty
$ref_clock ($path_group)
    }
STEP S3
# set critical range on the design to be > 2x worst slack plus
2x margin
set range_value [ expr floor ( ( $worst_slack - $SETUP_MARGIN )
/ $GRANULARITY ) \* $GRANULARITY \* -2.0 ]
if {$range_value > 0 } \
```

ANNEX I-continued

```
    {
    set_critical_range $range_value $ms_dName
    }
STEP S4
# This compile attempts to fix all paths to be better than WNS
from target
if { $range_value > 0 } \
    {
    compile -inc -area none
    } \
else \
    {
    source $TOOL_PATH/bin/area_recovery.tcl
    }
update_timing
STEP S5
# reset uncertainty to original value on each clock
foreach path_group $RR_PATH_GROUP_LIST \
    {
    if {$ref_slack($path_group) < $SETUP_MARGIN } \    {
        set_clock_uncertainty    [    expr    $SETUP_
                MARGIN    +
$ref_uncertainty($path_group) ] $ref_clock($path_group)
        echo "setting clock uncertainty of" [ expr $SETUP_MARGIN +
$ref_uncertainty($path_group) ] $ref_clock($path_group)
        }
    }
update_timing
# now have over constrained design with original constraints
write -format db -hier -o db/over_constrained.db
STEPS S6/S7
# Look for active clock skew possibilities
set suppress_errors [ list UID-85 TIM-134 ]
foreach path_group $RR_PATH_GROUP_LIST \
    {
    if {$ref_slack($path_group) < $SETUP_MARGIN } \
        {
        set better true
        set critical_path [ get_timing_paths -group $path_group ]
        set running_slack [ get_attribute $critical_path slack ]
        while { [ is_true $better ] && $running_slack <0 } \
            {
            # This is the core of the algorithm that investigates the
skewing possibilities
            source $TOOL_PATH/bin/apply_skew.tcl
            }
        }
    }
# write new sdc file with extra set_clock_latency commands
write_sdc
deliverables/$ms_dName.active_clock_skew.implementation.sdc
# set original critical range
if { [is_false [info exists CRITICAL_RANGE ] ] } \
    {
    set CRITICAL_RANGE 0.0
    }
set_critical_range $CRITICAL_RANGE $ms_dName
# compile to finalised new constraints
compile -inc
# check final result
report_constraint
# write new netlist
set verilogout_no_tri {true}
set verilogout_single_bit {false}
set verilogout_equation {false}
change_names -rules verilog -hierarchy
write    -format    verilog    -hier    -o
deliverables/$ms_dName.active_clock_skew.v
echo ""> temp/active_clock_skew_ok
exit
```

ANNEX II

```
    set better false
#################################################################
STEP 7a      # Type 1 skew, look to delay endpoint, investigate
Path B
#################################################################
    echo -n "."
    # process end_reg
    set    endpoint    [    get_object_name    ]    get_attribute
$critical_path endpoint ] ]
    set clock_name    [    get_object_name    [    get_attribute
$critical_path endpoint_clock
    # If endpoint is clock gating cell, can't proceed
    set endpoint_is_clock gating_cell I filter_collection
get_cells -of_objects $endpoint ] "@clock_gating integrated_cell
== latch posedge precontrol"]
    set cg_cell_is_endpoint "false"
    if { $endpoint_is_clock_gating_cell != "" } \
    {
        echo "Warning: found clock gating cell as endpoint"
$endpoint
        set cg_cell_is_endpoint "true"
    }
    set timing_from_endpoint –999.0
    set endpoint_from_endpoint "INVALID"
    if {[is_false $cg_cell_is_endpoint ]}\
    {
    set point $endpoint
    # get all endpoints if bussed register
    source $TOOL_PATH/bin/wild.tcl
    set endpoint_wild $wild
    set endpoint_bussed $bussed
    set endpoint_clock_pin    [    get_attribute -quiet
$critical_path endpoint_clock_pin
    set valid false
    if { $endpoint clock_pin !=""} \
    {
        set valid true
        set    endpoint clock    [    get_object_name
$endpoint_clock_pin ]
    }
    set point $endpoint_clock
    # get all enpoints if bussed register
    source $TOOL_PATH/bin/wild.tcl
    set endpoint_clock_wild $wild
    if { [ is_true $valid ]} \
    {
        set timing from_end_point_path    [    get_timing_paths -
group $path_group -from $endpoint_clock_wild ]
        if { [ sizeof_collection $timing_from_endpoint_path ]
> 0 } \
        {
            set timing_from_endpoint    [    get_attribute
$timing_from_endpoint_path slack ]
            set endpoint_from_endpoint    [    get_
                object_name    ]
get_attribute $timing_from_endpoint_path endpoint ] ]
        } \
        else \
        {
        # no paths indicates unused register
        set    timing_from_endpoint    [    expr    –1.0    \*
$running_slack ]
        }
    }
}
#################################################################
STEP 7b    # Type 2 skew, look to advance startpoint,
investigate path A
#################################################################
    echo -n "."
    # process start_reg
    set startpoint    [    get_object_name    [    get_attribute
$critical_path startpoint ]
    set point $startpoint
    # get all enpoints if bussed register
```

ANNEX II-continued

```
    source $TOOL_PATH/bin/wild.tcl
    set startpoint_wild $wild
    set startpoint_bussed $bussed
    set clock_pin $startpoint
    # find data pin with worst case timing
    source $TOOL_PATH/bin/clock_to_data_pin.tcl
    set startpoint_data $data pin
    set timing_to_startpoint $min_slack
    set timing_to_startpoint_valid $valid
    set startpoint_to_start $startpoint_to_data pin
    set point $startpoint_data
    source $TOOL_PATH/bin/wild.tcl
    set startpoint_data_wild $wild
    if { [ is_false $valid ] } \
    {
        # no paths indicates tie-off
        set timing_to_startpoint [ expr –1.0 \* $running_slack ]
    }
    echo ""
    echo ""
    echo
"#################################################################"
    echo "Critical Path Info:"
    echo "      Source:" $startpoint_wild
    echo "      Destination:" $endpoint_wild
    echo "      Slack:" $running_slack
    echo
"#################################################################"
    echo ""
    echo
"#################################################################"
    echo "Type 1    Path Info:"
    echo "      Source:" $endpoint_clock_wild
    echo "      Destination:"$endpoint_from_endpoint
    echo "      Slack:"$timing_from_endpoint
    echo
"#################################################################"
    echo ""
    echo
"#################################################################"
    echo "Type 2    Path Info:"
    echo "      Source:"$startpoint_to_start
    echo "      Destination:"$startpoint_data_wild
    echo "      Slack:"$timing_to_startpoint
    echo
"#################################################################"
    echo ""
"#################################################################"
STEP 7c    # Decision Tree
    #    If both are giving required improvement prefer
single bit register
    #    Otherwise pick the one with the better
improvement
"#################################################################"
    set skew_type "Null"
    if { $timing_from_endpoint > $GRANULARITY } \
    {
        if { $timing_to_startpoint > $GPANULARITY } \
        {
            if {[is_true $startpoint_bussed ] } \
            {
            set skew_type "Type1"
            } \
            else \
            {
            set skew_type "Type2"
            }
        }\
        else \
        {
        set skew_type "Type1"
```

ANNEX II-continued

```
            }
        } \
    else \
        {
        if { $timing_to_startpoint > $GRANULARITY } \
            {
            set skew_type "Type2"
            }
        }
    if { $skew_type =="Null" }\
        {
        if { $timing_from_endpoint > [ expr $running_slack +
$GRANULARTTY ] }\
            {
            if { $timing_to_startpoint > [ expr $running_slack +
$GRANULIARITY ] } \
                {
                if { $timing_from_endpoint > $timing_to_startpoint }
\
                    {
                    set skew_type "Type1"
                    } \
                else \
                    {
                    set skew_type "Type2"
                    }
                } \
            else \
                {
                set skew_type "Type1"
                }
            } \
        else \
            {
            if { $timing_to_startpoint > [expr $running_slack +
$GRANULARITY ] } \
                {
                set skew_type "Type2"
                }
            }
        }
STEP 7d # Increase clock latency on end_reg, increase latency y
    if {$skew_type =="Type1"}\
        {
        set    end_clock_latency    [    get_attribute   -quiet
$critical_path endpoint_clock_latency
        if { $end_clock_latency =="" } \
            {
            set end_clock_latency 0.0
            }
        set midpoint_delay    [    expr ( $timing_from_endpoint -
$running_slack ) / 2 ]
        set    rounded_midpoint_delay    ]    expr   floor  (
$midpoint_delay / $GRANULARITY ) \* $GRANULARITY +
$GRANULARITY
]
        if { $rounded_midpoint_delay > 0 } \
            {
            echo  "Setting   clock   latency   of"  [  expr
$end_clock_latency + $GRANULARITY ] "on" $endpoint_clock_wild
            set_clock_latency -max [ expr $end_clock_latency +
$GRANULARITY ] $endpoint_clock_wild
            set better true
            }
        }
STEP 7e 190 Decrease clock latency on start_reg, decrease latency
x
    if { $skew_type == "Type2" }\
        {
        set   start_clock_latency   [  get_attribute  -quiet
$critical_path startpoint_clock_latency ]
        if { $start_clock_latency == "" } \
            {
            set start_clock_latency 0.0
            }
        set midpoint_delay [ expr ( $timing_to_startpoint -
$running_slack ) / 2]
        set    rounded_midpoint_
        delay   [   expr   floor (
```

ANNEX II-continued

```
$midpoint_delay / $GRANULARITY ) \* $GRANULARITY +
$GRANULARITY
]
        if { $rounded_midpoint_delay > 0 } \
            {
            echo  "Setting   clock   latency   of"  [  expr
$start_clock_latency- $GRANULARITY ] "on" $startpoint_wild
            set_clock_latency -max [ expr $start_clock_latency -
$GRANULARITY ] $startpoint_wild
            set better true
            }
        }
    if { [ is_true $better] } \
        {
        set critical_path [get_timing_paths -group $path_group
]
        set new_slack [ get_attribute $critical_path slack
        echo "Slack changed from" $running_slack "to"$new_slack
"improvement"[ expr $new_slack - $running_slack
        echo ""
        set running_slack $new_slack
        }
```

What is claimed is:

1. For use in producing integrated circuits, a method of controlling a clock tree synthesis tool, the method comprising:
   inputting data defining a circuit to be synthesized, said circuit comprising a plurality of timing paths;
   comparing delays of each of said timing paths;
   setting a clock latency for at least one of: a start point and an end point of at least one of said timing paths according to said comparison; and
   outputting timing constraints to control a clock tree synthesis tool, wherein said timing constraints comprise commands defining said clock latencies.

2. The method according to claim 1, wherein each of said timing paths comprises a first, a second and a third timing portion.

3. The method according to claim 2, wherein said step of comparing compares only delays on each of said first and said third timings portions.

4. The method according to claim 1, wherein said timing constraints are supplied to a cell placement tool.

5. The method according to claim 4, wherein said cell placement tool outputs a control signal to the clock tree synthesis tool.

6. The method according to claim 1 further comprising:
   inputting an initial timing constraint with said data defining said circuit to be synthesized.

7. The method according to claim 1 further comprising:
   outputting new data defining said circuit to be synthesized with said timing constraints.

8. The method according to claim 1, wherein said data is a Netlist.

9. The method according to claim 1 further comprising:
   establishing minimum values of said delays prior to said compare step; and
   comparing said minimum values.

10. The method according to claim 1 further comprising:
    storing said timing constraints in memory.

11. A method of generating timing constraints for use in producing an integrated circuit, the method comprising:
    inputting data defining a circuit to be synthesized, said circuit comprising a plurality of timing paths each including at least one of: a first timing portion, a second timing portion, and a third timing portion;

comparing delays on each of said first and third timing portions of each of said timing paths;

according to said comparison, setting a clock latency for at least one of: a start point and an end point of said second timing portion of at least one of said timing paths; and outputting said timing constraints to control a clock tree synthesis tool, wherein said timing constraints comprise commands defining said clock latencies.

12. The method according to claim 11, wherein said timing constraints are supplied to a cell placement tool, wherein said cell placement tool outputs a control signal to said clock tree synthesis tool.

13. The method according to claim 11 further comprising: inputting an initial timing constraint with said data defining said circuit to be synthesized.

14. The method according to claim 11 further comprising: outputting new data defining said circuit to be synthesized with said timing constraints.

15. The method according to claim 11, wherein said data is a Netlist.

16. The method according to claim 11 further comprising: establishing minimum values of said delays prior to said compare step; and comparing said minimum values.

17. The method according to claim 11 further comprising: storing said timing constraints in memory.

18. A system to generate timing constraints to control a clock tree synthesis tool, the system comprising:

an input to receive data defining a circuit to be synthesized, said circuit including a plurality of timing paths, each including a start portion, a critical path and an end portion, wherein said system is operable to:

report the worst negative slack for all timing paths and to set a critical range, improve at least one of said timings paths by incrementing a compile step by the worst negative slack, wherein if the worst negative slack does not satisfy preset criteria, then analyzing the delay on each start and end portion to adjust clock latencies to improve the worst negative slack.

19. The system according to claim 18, wherein said data is a Netlist.

20. The system according to claim 18, wherein said tool is operable using a computer.

* * * * *

UNITED STATES PATENT AND TRADEMARK OFFICE
CERTIFICATE OF CORRECTION

PATENT NO. : 7,739,641 B1  
APPLICATION NO. : 11/700532  
DATED : June 15, 2010  
INVENTOR(S) : Paul Barnes Page 1 of 1

It is certified that error appears in the above-identified patent and that said Letters Patent is hereby corrected as shown below:

On the Title Page:

The Assignee should read

-- STMicroelectronics (Research & Development) Limited --

Signed and Sealed this
Twenty-second Day of July, 2014

Michelle K. Lee
*Deputy Director of the United States Patent and Trademark Office*